(12) United States Patent
Ku et al.

(10) Patent No.: US 7,595,729 B2
(45) Date of Patent: Sep. 29, 2009

(54) RFID TAG AND RFID SYSTEM HAVING THE SAME

(75) Inventors: Ja-nam Ku, Yongin-si (KR);
Seong-hearn Lee, Seoul (KR);
Dong-hyun Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 357 days.

(21) Appl. No.: 11/583,936

(22) Filed: Oct. 20, 2006

(65) Prior Publication Data
US 2007/0171065 A1 Jul. 26, 2007

(30) Foreign Application Priority Data
Jan. 20, 2006 (KR) .................. 10-2006-0006463

(51) Int. Cl.
*G08B 13/14* (2006.01)
*H04Q 5/22* (2006.01)
*H04B 5/00* (2006.01)

(52) U.S. Cl. .................. 340/572.1; 340/10.4; 340/235; 455/41.1; 455/41.2

(58) Field of Classification Search .............. 340/572.1, 340/10.4, 10.42, 235, 435, 436, 449, 451; 455/41.1, 41.2, 41.3; 343/822, 860, 861, 343/913
See application file for complete search history.

(56) References Cited

U.S. PATENT DOCUMENTS

| | | | | |
|---|---|---|---|---|
| 5,598,169 | A * | 1/1997 | Drabeck et al. ............. | 343/701 |
| 5,606,323 | A * | 2/1997 | Heinrich et al. ........... | 340/10.34 |
| 6,870,461 | B2 * | 3/2005 | Fischer et al. .............. | 340/10.1 |
| 2003/0067026 | A1 * | 4/2003 | Bulucea ...................... | 257/303 |
| 2003/0102961 | A1 * | 6/2003 | Fischer et al. .............. | 340/10.1 |
| 2004/0257293 | A1 * | 12/2004 | Friedrich et al. ............ | 343/860 |
| 2006/0199604 | A1 * | 9/2006 | Walton et al. ............... | 455/522 |
| 2007/0035356 | A1 * | 2/2007 | Ranta ......................... | 333/17.3 |
| 2007/0098118 | A1 * | 5/2007 | Muhammad et al. ........ | 375/344 |

OTHER PUBLICATIONS

Backscatter modulation of Impedance Modulated RFID tags. Chris Turner IEng MIIE Feb. 2003.*
Brillouin Backscattering in an Electron Beam-Plasma System J. E. Willett and Y. Aktas Department of Physics, University of Missouri-Columbia, Columbia, MO 6521 1, U.S.A. (Received Sep. 28, 1982; and in revised form Jan. 25, 1983).*

* cited by examiner

*Primary Examiner*—Daniel Wu
*Assistant Examiner*—Fekadeselassie Girma
(74) *Attorney, Agent, or Firm*—Sughrue Mion, PLLC

(57) ABSTRACT

An RFID tag capable of enhancing the reliability of products and an RFID system having the same are provided. The RFID tag includes a tag antenna receiving waves from an RFID reader, and a tag driver. The tag driver includes an accumulation mode capacitor adjusting a capacitance value corresponding to an input voltage. That is, the tag driver adjusts the amplitude of a modulated carrier wave using the accumulation mode capacitor. Accordingly, the RFID tag adjusts the impedance of the tag driver without adjusting the current transmitted from the tag driver. Therefore, impedance adjustment of the tag driver can prevent the voltage transmitted from the tag driver from being lower than the reference voltage, and modulation and demodulation can be stably performed. As a result, the reliability of products can be enhanced.

8 Claims, 4 Drawing Sheets

RFID TAG AND RFID SYSTEM HAVING THE SAME

CROSS-REFERENCE TO RELATED APPLICATIONS

This application claims priority from Korean Patent Application No. 10-2006-0006463, filed Jan. 20, 2006 in the Korean Intellectual Property Office, the entire contents of which are incorporated herein by reference.

BACKGROUND OF THE INVENTION

1. Field of the invention

The present invention relates to a radio frequency identification (RFID) tag and an RFID system having the same. More particularly, the present invention relates to an RFID tag to stably control impedance on transmitting a carrier wave and an RFID system having the same.

2. Description of the Related Art

RFID is an automatic recognition technology using wireless frequencies and is a representative new technology of a contactless integrated circuit (IC) card to replace a barcode and a magnetic card.

The RFID system includes an RFID reader, a host computer and a transponder, that is, an RFID tag.

The RFID reader transmits radio waves to the RFID tag, and the RFID tag receives the radio waves and transmits corresponding data to the RFID reader.

The RFID tag includes an antenna transmitting and receiving radio waves to/from the RFID reader and a driving chip storing data such as identification information to identify each RFID tag. If the RFID tag receives radio waves from the RFID reader, the RFID tag transmits the corresponding data including the identification information to the RFID reader.

The RFID tag separates into active and passive tags according to the operation method. The active RFID tag has a power source to drive itself. Meanwhile, the passive RFID tag does not have a power source to drive itself, but receives radio waves and a power to drive itself from the RFID reader.

After receiving an input power, the passive RFID tag generates a carrier wave and transmits a carrier power to the RFID reader. The RFID tag loads predetermined data including the identification information into the carrier wave, modulates the data into electric signals and transmits the power to the RFID reader.

The RFID tag adjusts a resistance corresponding to the driving chip by turning on/off a transistor embedded in the driving chip on transmitting the carrier wave, so that impedance of the driving chip is adjusted. Impedance adjustment of the RFID tag is essential to minimize reflection signals between the RFID reader and the RFID tag. That is, if impedance matching between the RFID reader and the RFID tag is not accurately performed, a reflection coefficient between the RFID reader and the RFID tag become high and the reflection signals increase so that power loss of the RFID reader increases.

To prevent this, the RFID tag adjusts resistance of the driving chip according to the size of the carrier wave for impedance matching using a modulation transistor.

FIG. 1 is a graph illustrating an output voltage of the RFID tag corresponding to signal transmission and reception in a related art RFID system.

Referring to FIG. 1, the RFID reader transmits an input power (IP) and the RFID tag receives the IP. The RFID tag transmits a reflection power (RP) to transmit a carrier wave corresponding to the IP to the RFID reader. The RP contains a carrier wave modulated to include a signal wave indicating the identification information of the RFID tag.

The amplitude of the carrier wave varies corresponding to the amplitude of the signal wave, that is, a digital data value of the signal wave in the modulation process. That is, the driving chip of the RFID tag changes the amplitude of the carrier wave by adjusting the voltage. Accordingly, the impedance of the driving chip can vary corresponding to the amplitude variation of the data signal.

To prevent this, the RFID tag modifies a resistance of the driving chip using the modulation transistor. That is, the modulation transistor is turned on/off corresponding to the amplitude variation of the carrier wave to adjust the current of the driving chip. Accordingly, the RFID tag can adjust the resistance of the driving chip so that the impedance of the driving chip can be adjusted.

However, if the modulation transistor is turned on so that current consumption increases, the intensity of voltage transmitted from the driving chip can be lower than the reference voltage Vdd (A, B). The voltage output from the RFID tag, that is, the voltage transmitted from the driving chip has to be higher than the reference voltage Vdd. If the modulation transistor is turned off again, the current consumption is suddenly reduced. Accordingly, the voltage output from the driving chip is higher than the reference voltage Vdd.

As described above, as the variation of voltage transmitted from the driving chip increases according to the amplitude variation of a data signal in the RFID tag, circuits embedded in the RFID tag can unstably drive. Accordingly, the power supply of the RFID tag is unstable, and modulation and demodulation are unstable, so that signal transmission/reception between the RFID reader and the RFID tag cannot be normally performed.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides an RFID tag to improve the reliability of products by stably adjusting the voltage on transmission of a carrier wave.

The present invention also provides an RFID system including the RFID.

According to an aspect of the present invention, there is provided the RFID tag comprising a tag antenna and a tag driver.

The tag antenna receives an input power from an RFID reader and radiates a reflection power corresponding to the input power to the RFID reader. The tag driver is electrically connected to the tag antenna, modulates a carrier wave corresponding to the input power, provides the modulated carrier wave and the reflection power to the tag antenna, and adjusts a capacitance according to the intensity of the modulated carrier wave for impedance matching with the tag antenna.

More specifically, the tag driver comprises a memory storing data, a controller detecting the data from the memory corresponding to the input power, modulating the carrier wave, and generating the reflection power with the carrier wave modulated corresponding to the input power; and an accumulation mode capacitor adjusting an impedance of the tag driver by adaptively adjusting the capacitance according to the intensity of a voltage of the reflection power, and receiving the reflection power from the controller and providing the reflection power to the tag antenna.

Additionally, in the accumulation mode capacitor, if the voltage of the reflection power is lower than a threshold voltage, the capacitance value increases, and if the voltage of the reflection power is higher than the threshold voltage, the capacitance value decreases.

The accumulation mode capacitor may comprise at least one varactor connected to an input pad and ground pad of the RFID antenna.

The varactor comprises a gate part receiving the voltage of the reflection power, a source part, and a drain part connected to the source part, and the gate part is electrically connected to a connecting line which connects the source part and the drain part.

In the accumulation mode capacitor, the capacitance value is changed if the reflection power is higher than a minimum power for backscattering, which modulates the carrier wave and loads the signal wave including the data into the carrier wave.

The minimum power for backscattering is calculated as below:

$$P_{bs} = \frac{P_a}{4} \times |\rho_1 - \rho_2|^2,$$

where $P_{bs}$ is the minimum power for backscattering, $P_a$ is an effective power which is transmitted from the tag antenna and input to the tag driver, $\rho_1$ is a reflection coefficient when a digital signal value of the signal wave is 0, and $\rho_2$ is a reflection coefficient when the digital signal value of the signal wave is 1.

The effective power may be an effective isotropic radiation power of the tag antenna, and the minimum power for backscattering may be approximately −70 dBm.

Meanwhile, the tag driver keeps a predetermined impedance regardless of amplitude variation of the carrier wave modulated through backscattering.

The impedance of the tag antenna may be a complex conjugate of the impedance of the tag driver.

According to another aspect of the present invention, there is provided an RFID system comprising an RFID reader and an RFID tag.

The RFID reader radiates an input power. The RFID tag comprises a tag antenna receiving the input power from the RFID reader and radiating a reflection power including a carrier wave to the RFID reader, and a tag driver electrically connected to the tag antenna. The tag driver comprises a memory storing data, a controller detecting the data from the memory corresponding to the input power, modulating the carrier wave, and generating the reflection power with the carrier wave modulated corresponding to the input power, and an accumulation mode capacitor adjusting an impedance of the tag driver by adaptively adjusting the capacitance according to the intensity of a voltage of the reflection power, and receiving the reflection power from the controller and providing the reflection power to the tag antenna.

Accordingly, as the RFID tag can adjust the impedance of the tag driver by adjusting the capacitance value, it can prevent the voltage transmitted from the tag driver from being lower than the reference voltage, and modulation and demodulation can be stably performed. As a result, the reliability of products can be enhanced.

BRIEF DESCRIPTION OF THE DRAWING FIGURES

The above and other aspects of the present invention will become more apparent by describing in detail exemplary embodiments thereof with reference to the attached drawing figures, wherein.

DETAILED DESCRIPTION OF THE EXEMPLARY EMBODIMENTS

Figure 1:
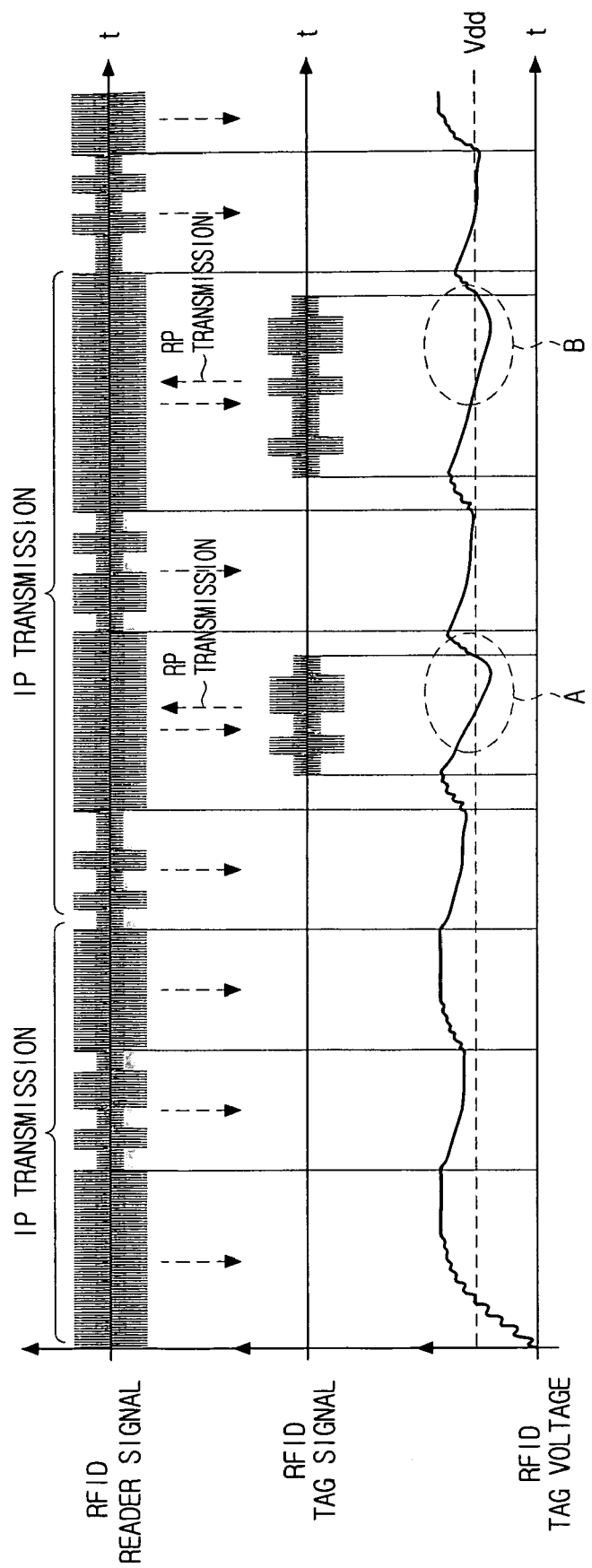
FIG. 1 is a graph illustrating an output voltage of an RFID tag corresponding to signal transmission/reception in a related art RFID system.

Hereinafter, exemplary embodiments of the present invention will be described in detail with reference to the accompanying drawing figures.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
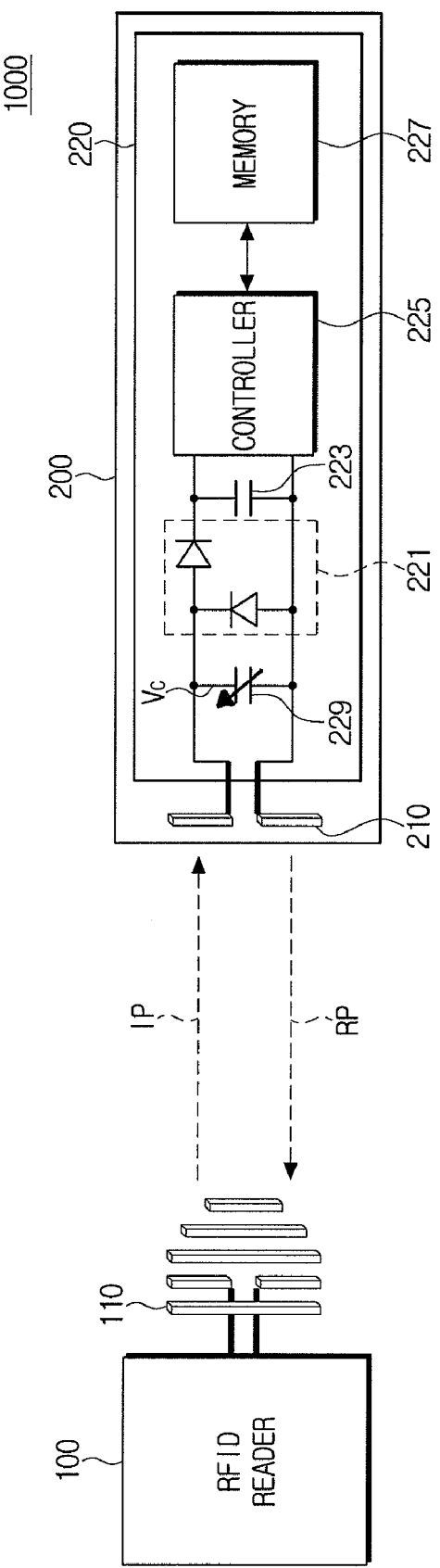
FIG. 2 is a schematic diagram illustrating an RFID system according to an exemplary embodiment of the present invention.

FIG. 2 is a schematic diagram illustrating an RFID system according to an exemplary embodiment of the present invention.

Referring to FIG. 2, the RFID system 1000 according to an exemplary embodiment of the present invention includes an RFID reader 100 and an RFID tag 200.

More specifically, the RFID reader 100 includes an antenna 110 radiating a radio wave and transmits/receives data to/from the RFID tag 200 using radio frequency.

The RFID tag 200 stores predetermined data including an identifier (ID) given for each RFID tag to identify each RFID tag. If the RFID tag 200 is located in the read range of the RFID reader 100, that is, in the magnetic field or electrical field, the RFID tag 200 receives waves radiated from the RFID reader 100. The wave output from the RFID reader 100 includes an input power IP to drive the RFID tag 200.

If the RFID tag 200 receives the input power IP from the RFID reader 100, the RFID tag 200 transmits the data including the ID to the RFID reader 100. That is, the RFID tag 200 transmits a reflection power RP including the data to the RFID reader 100, corresponding to the input power IP.

In detail, the RFID tag 200 includes a tag antenna 210 transmitting/receiving waves to/from the RFID reader 100 and a tag driver 220 generating the reflection power RP using the input power IP.

The tag antenna 210 receives an input power IP from the RFID reader 100 to transmit to the tag driver 220, and receives a reflection power RP from the tag driver 220 to radiate to the RFID reader 100. The RFID reader 100 authenticates the RFID tag 200 using the data included in the reflection power RP.

The tag driver 220 is connected to an input pad and ground pad of the tag antenna 210. In this exemplary embodiment, the tag driver 220 can consist of at least one element.

The tag driver 220 includes a rectifier 221, a smoother 223, a controller 225, a memory 227 and an accumulation mode capacitor 229.

The rectifier 221 converts the input power IP from alternating current to direct current. The smoother 223 is connected to the rectifier 221 in parallel and outputs the input voltage by converting an alternating current component of the power output from the rectifier 221 into direct current. The input voltage is used to drive internal elements including the controller 225 and the memory 227.

The controller 225 receives the input voltage from the smoother 223 and generates a reflection power RP using data stored in the memory 227 and the input power IP. The memory 227 stores the ID to identify the RFID tag 200 and other data.

More specifically, the controller 225 detects the ID from the memory 227 corresponding to the input power IP and generates a signal wave including the detected ID. The signal wave can carry the ID of the RFID tag 200 and other data.

The controller 225 modulates and outputs the carrier wave according to the signal wave, corresponding to the input power IP. The controller 225 performs modulation by adjusting a voltage in order for the amplitude of the carrier wave to vary corresponding to the amplitude of the signal wave and this kind of modulation method is called amplitude modulation. The controller 225 modifies the amplitude of the carrier wave by adjusting an output voltage Vc of the tag driver 220, that is, the intensity of the voltage of the carrier power RP, and the amplitude of the signal wave varies according to a digital signal corresponding to the signal wave.

The modulated carrier wave is included in the reflection power RP and transmitted to the RFID reader 100 through the tag antenna 210. The RFID reader 100 demodulates the carrier wave and reads the ID of the RFID tag 200. Accordingly, the RFID reader 100 authenticates the RFID tag 200.

As described above, the process in which the RFID tag 200 modulates the carrier wave and transmits the carrier wave to the RFID reader 100 is called backscattering.

The accumulation mode capacitor 229 is connected to the tag antenna 210 in parallel. The accumulation mode capacitor 229 adjusts the capacitance value corresponding to the value of the output voltage Vc so that the impedance of the tag driver 220 is adjusted.

That is, the impedance of the tag driver 220 adjusted by the capacitance value of the tag driver 220, the intensity of the current of the tag driver 220 and the intensity of the output voltage Vc.

More particularly, the tag driver 220 adjusts the amplitude of the carrier wave by adjusting the voltage in the process of modulating the carrier wave. Accordingly, the intensity of the output voltage Vc is adjusted by the size of the amplitude of the modulated carrier wave so that the impedance of the tag driver 220 varies according to the size of the amplitude of the carrier wave.

However, the impedance of the tag driver 220 has to keep a regular value regardless of the size of the amplitude of the carrier wave for impedance matching with the tag antenna 210. Particularly, when the impedance Zc of the tag driver 220 is a complex conjugate of the impedance Za of the tag antenna, impedance is precisely matched. This is as shown in Equation 1.

$$Zc = Za^*$$  [Equation 1]

The tag driver 220 must maintain the impedance of a regular value for impedance matching with the tag antenna 210, but the impedance Zc of the tag driver 220 can be changed according to the amplitude of the modulated carrier wave.

To prevent this, the accumulation mode capacitor 229 adjusts its capacitance value corresponding to the output voltage so that the tag driver 220 can maintain the regular impedance regardless of the intensity of the output voltage Vc. That is, in the accumulation mode capacitor 229, if the output voltage Vc increases, the capacitance value decreases, and if the output voltage Vc decreases, the capacitance value increases.

Accordingly, the capacitance value of the accumulation mode capacitor 229 is inversely proportional to the intensity of the output voltage Vc and the accumulation mode capacitor 229 compensates impedance variation occurred due to the intensity difference of the output voltage Vc. Therefore, the tag driver 220 can maintain the impedance regular regardless of the size of the amplitude of the modulated carrier wave.

As described above, the RFID tag 200 adjusts the impedance by adjusting the capacitance value according to the size of the amplitude of the carrier wave, so that the intensity of the voltage and current transmitted from the tag driver 220 does not need to be adjusted for impedance adjustment. Accordingly, the RFID tag 200 can prevent the output voltage Vc transmitted from the tag driver 220 from being lower than the reference voltage, and modulation and demodulation can be stably performed so that the reliability of products can be enhanced.

In addition, as the RFID tag 200 does not need a transistor to adjust the impedance, power consumption by turning on/off the transistor can be prevented and the low-power RFID tag 200 can be implemented.

Furthermore, since the RFID tag 200 can enhance impedance matching between the tag antenna 210 and the tag driver 220, the reflection coefficient between the RFID reader 100 and the RFID tag 200 can be reduced. Accordingly, the RFID system 1000 can enhance power use efficiency and extend the read range of the RFID reader 100.

Figure 3:
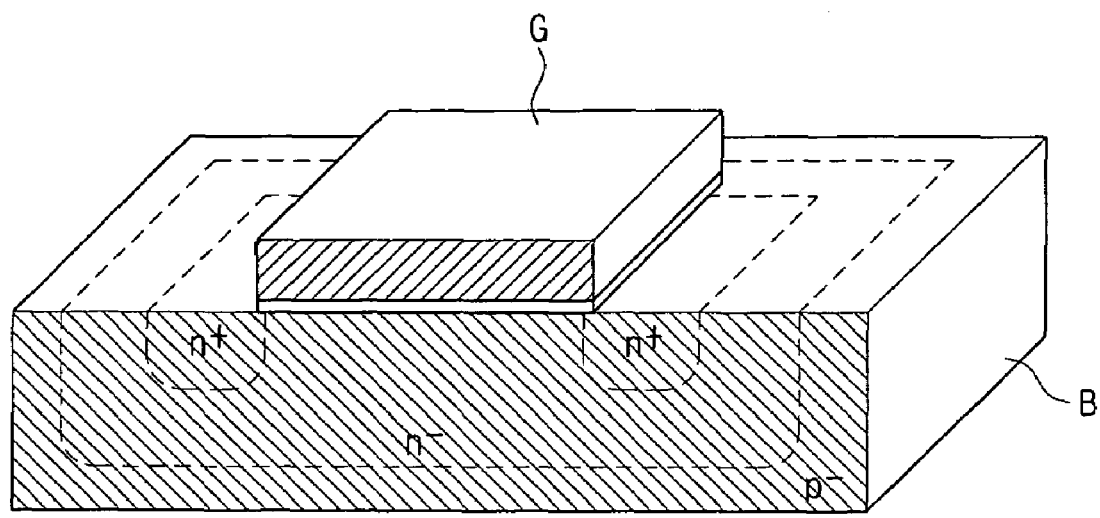
FIG. 3 is a perspective view illustrating a varactor applied to the accumulation mode capacitor of FIG. 2 according to an exemplary embodiment of the present invention.
Figure 4:
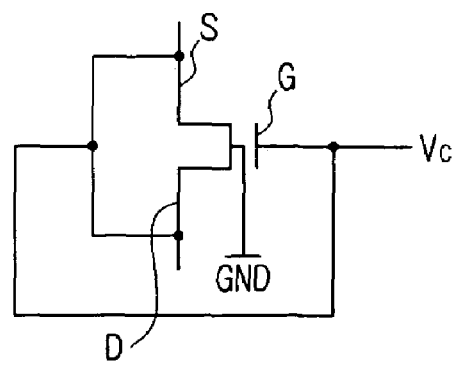
FIG. 4 is a circuit diagram illustrating the varactor of FIG. 3.

FIG. 3 is a perspective view illustrating a varactor applied to the accumulation mode capacitor of FIG. 2, and FIG. 4 is a circuit diagram illustrating the varactor of FIG. 3.

Referring to FIGS. 2 to 4, the accumulation mode capacitor 229 includes at least one metal oxide semiconductor (MOS) varactor 229a. The varactor 229a is a variable capacitance diode whose capacitor's value varies according to the input voltage.

More specifically, the varactor 229a includes a gate part G formed on a base substrate B, a source part S and a drain part D. The area adjacent to where the gate part G is formed on the base substrate B is doped with n+. The output voltage Vc is transmitted to the gate part G. The source part S and the drain part D are electrically connected to each other, and a line which connects the source part S and the drain part D is electrically connected to the gate part G.

If the output voltage Vc to be input to the gate part G in the varactor 229a is transmitted lower than a threshold voltage, the capacitance value increases. However, if the output voltage Vc to be input to the gate part G in the varactor 229a is transmitted higher than a threshold voltage, the capacitance value decreases.

Figure 5:
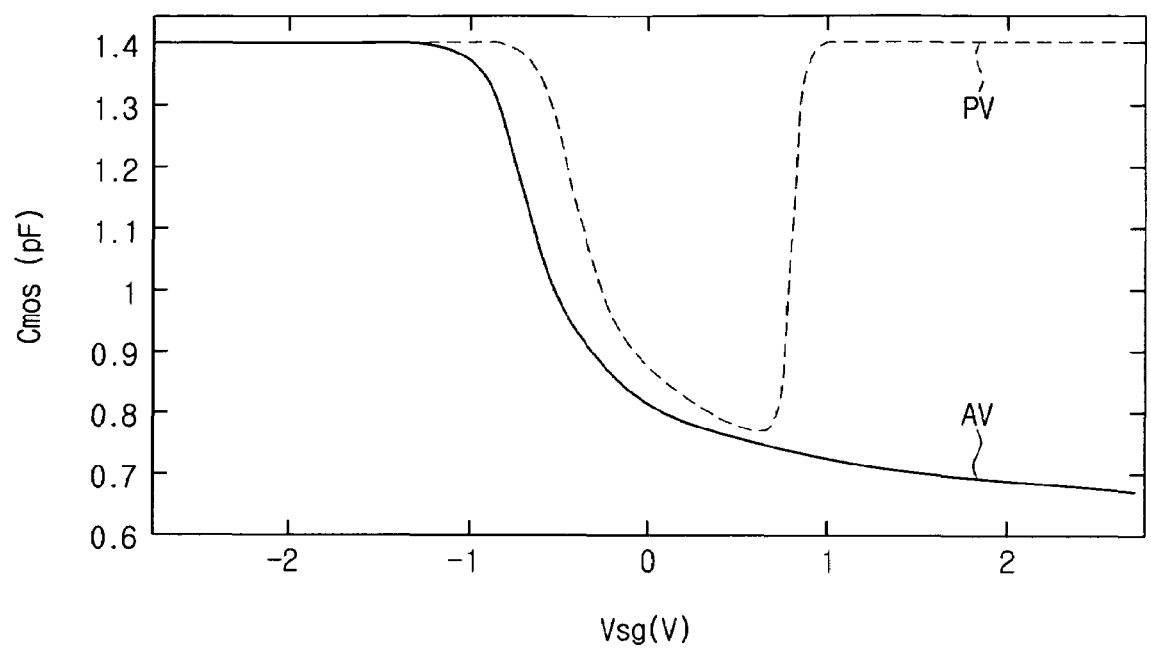
FIG. 5 is a graph illustrating a relation between capacitance and source part-gate part voltage in the accumulation mode capacitor of FIG. 2.

FIG. 5 is a graph illustrating the relation between capacitance and source part-gate part voltage in the accumulation mode capacitor of FIG. 2.

Referring to FIGS. 4 and 5, in the accumulation mode capacitor AV, the higher the voltage Vsg between the source part S (shown in FIG. 4) and the gate part G (shown in FIG. 4) is, the lower the capacitance value is.

Meanwhile, in the P-MOS capacitor PV, when the voltage between source part S and gate part G ranges from about −1V to about 1V, the capacitance value gradually decreases. However, when the voltage between source part S and gate part G is higher than about 1V, the capacitance value sharply increases.

Referring to FIG. 2, when the reflection power RP is higher than the reference power, the capacitance value of the accumulation mode capacitor 229 is changed. The reference power is a minimum power by which the RFID reader 100 can read the RFID tag 200 and is also a minimum power $P_{bs}$ required for backscattering.

Hereinafter, the process of calculating the minimum power $P_{bs}$ is described in detail.

Equation 2 below is an equation to calculate the minimum power $P_{bs}$ using current values $I_1$ and $I_2$ of the tag driver 220 and a resistance of the tag antenna 210.

$$P_{bs} = \frac{|I_1 - I_2|^2}{8} \times R_{rad} \quad \text{[Equation 2]}$$

In Equation 2, $I_1$ and $I_2$ are the current of the tag driver 220, and $R_{rad}$ is the radiation resistance of the tag antenna 210. Hereinafter, for convenience sake, when the digital signal value corresponding to the signal wave is 0, the current of the tag driver 220 is referred to as the first current $I_1$, and when the digital signal value corresponding to the signal wave is 1, the current of the tag driver 220 is referred to as the second current $I_2$.

The first and second currents $I_1$ and $I_2$ are calculated using Equation 3 below.

$$I_1 = \frac{V_a}{Z_a + Z_1} = \frac{V_a}{2 \times R_a} \times (1 - \rho_1) \quad \text{[Equation 3]}$$

$$I_2 = \frac{V_a}{Z_a + Z_2} = \frac{V_a}{2 \times R_a} \times (1 - \rho_2)$$

In Equation 3, $V_a$ is the voltage transmitted to the tag antenna 210 by the input power IP, $Z_a$ is the impedance of the tag antenna 210, and $Z_1$ and $Z_2$ are the impedances of the tag driver 220. Hereinafter, for convenience sake, when the digital signal value of the signal wave is 0, the impedance of the tag driver 220 is referred to as the first impedance $Z_1$, and when the digital signal value of the signal wave is 1, the impedance of the tag driver 220 is referred to as the second impedance $Z_2$.

Accordingly, $I_1$ and $I_2$ can be calculated using the voltage $V_a$ transmitted to the tag antenna 210, the real number impedance $R_a$ of the tag antenna 210, and the first and second reflection coefficients $\rho_1$ and $\rho_2$. When the digital signal value corresponding to the signal wave is 0, the reflection coefficient is referred to as the first reflection coefficient $\rho_1$, and when the digital signal value corresponding to the signal wave is 1, the reflection coefficient is referred to as the second reflection coefficient $\rho_2$. The first and second reflection coefficients $\rho_1$ and $\rho_2$ are calculated through Equation 4 below.

$$\rho_1 = \frac{Z_1 - Z_a^*}{Z_1 + Z_a} \quad \text{[Equation 4]}$$

$$\rho_2 = \frac{Z_2 - Z_a^*}{Z_2 + Z_a}$$

$$Z_1 = Z_2 = Z_a^*$$

The impedances $Z_1$ and $Z_2$ of the tag driver 220 may be complex conjugate values of the impedance $Z_a$ of the tag antenna 210 for impedance matching with the tag antenna 210. As described above, the impedances $Z_1$ and $Z_2$ of the tag driver 220 have to be equal to complex conjugate values of the impedance $Z_a$ of the tag antenna 210 regardless of the amplitude of the signal wave for impedance matching with the tag antenna 210. To this end, the accumulation mode capacitor 229 adjusts the capacitance value according to the amplitude of the signal wave to make the first and second impedances $Z_1$ and $Z_2$ equal.

The average power to drive the tag driver 220 is lower than approximately 50% of an effective power $P_a$. The effective power $P_a$ is a power provided from the tag antenna 210 to the tag driver 220 and indicates effective isotropic radiated power (EIRP) of the tag antenna 210. Additionally, the minimum power $P_{bs}$ of the tag driver 220 is lower than approximately 25% of the effective power $P_a$. Accordingly, the minimum power $P_{bs}$ is calculated through Equation 5 below.

$$P_{bs} = \frac{P_a}{4} \times |\rho_1 - \rho_2|^2 = 10^{-10} W = -70 dBm \quad \text{[Equation 5]}$$

$$(\rho_1 - \rho_2) > \frac{1}{10^5}$$

Only when $\rho_1 - \rho_2$ is over $$\frac{1}{10^5},$$

the RFID reader 100 can recognize the RFID tag 200. The effective power Pa is approximately 4 W.

Accordingly, the minimum power Pbs of the tag driver 220 is approximately $10^{-10}$ W, that is, approximately −70 dBm. That is, when the reflection power RP transmitted from the tag driver 220 is over approximately −70 dBm, the RFID reader 100 can recognize the RFID tag 200. Therefore, the accumulation mode capacitor 229 changes the capacitance value in the state that the reflection power RP is over approximately −70 dBm.

As can be appreciated from the above description, the RFID tag includes the accumulation mode capacitor which adjusts the capacitance value according to the amplitude of the modulated carrier wave. Accordingly, the RFID tag adjusts the capacitance value to adjust the amplitude of the carrier wave without adjusting the voltage and current transmitted from the tag driver. Therefore, as the RFID tag can adjust the impedance by adjusting the capacitance value, it can prevent the voltage transmitted from the tag driver from being lower than the reference voltage, and modulation and demodulation can be stably performed. As a result, the reliability of products can be enhanced.

In addition, as the RFID tag does not need a transistor to adjust the impedance, power consumption by turning on/off the transistor can be prevented and a low-power RFID tag can be implemented.

Furthermore, the tag driver can adjust the capacitance value for precise impedance matching with the tag antenna so that reflection signals between the RFID tag and the RFID reader can be reduced. Consequently, the RFID system can enhance power use efficiency and the read range of the RFID reader can be extended.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A radio frequency identification (RFID) tag comprising:
    a tag antenna which receives an input power from an RFID reader and radiates a reflection power corresponding to the input power to the RFID reader; and
    a tag driver which is electrically connected to the tag antenna, modulates a carrier wave corresponding to the input power, provides the modulated carrier wave and the reflection power to the tag antenna, and adjusts a capacitance according to the intensity of the modulated carrier wave for impedance matching with the tag antenna,
    wherein the tag driver comprises:
    an accumulation mode capacitor, the capacitance is changed if the reflection power is higher than a minimum power for backscattering, which modulates the carrier wave and loads the signal wave including the data into the carrier wave, and the minimum power is calculated as below:

$$P_{bs} = \frac{P_a}{4} \times |\rho_1 - \rho_2|^2,$$

where $P_{bs}$ is the minimum power for backscattering, $P_a$ is an effective power which is transmitted from the tag antenna and input to the tag driver, $\rho_1$ is a reflection coefficient if a digital signal value of the signal wave is 0, and $\rho_2$ is a reflection coefficient when the digital signal value of the signal wave is 1.

2. The RFID tag of claim 1, wherein the tag driver further comprises:
    a memory which stores data;
    a controller which detects the data from the memory corresponding to the input power, modulates the carrier wave, and generates the reflection power with the carrier wave modulated corresponding to the input power; and
    the accumulation mode capacitor which adjusts an impedance of the tag driver by adaptively adjusting the capacitance according to the intensity of a voltage of the reflection power, receives the reflection power from the controller and provides the reflection power to the tag antenna.

3. The RFID tag of claim 2, wherein in the accumulation mode capacitor, the capacitance value increases if the voltage of the reflection power is lower than a threshold voltage, and the capacitance value decreases if the voltage of the reflection power is higher than the threshold voltage.

4. The RFID tag of claim 2, wherein the accumulation mode capacitor comprises at least one varactor connected to an input pad and a ground pad of the RFID antenna.

5. The RFID tag of claim 4, wherein the varactor comprises:
    a gate part which receives the voltage of the reflection power;
    a source part; and
    a drain part which is connected to the source part, and the gate part which is electrically connected to a connecting line which connects the source part and the drain part.

6. The RFID tag of claim 1, wherein the effective power is an effective isotropic radiation power of the tag antenna, and the minimum power for backscattering is approximately −70dBm.

7. The RFID tag of claim 1, wherein the impedance of the tag antenna is a complex conjugate of the impedance of the tag driver.

8. A radio frequency identification (RFID) system comprising:
    an RFID reader which radiates an input power; and
    an RFID tag comprising a tag antenna which receives the input power from the RFID reader and radiates a reflection power including a carrier wave to the RFID reader, and a tag driver which is electrically connected to the tag antenna,
    wherein the tag driver comprises:
    a memory which stores data;
    a controller which detects the data from the memory corresponding to the input power, modulates the carrier wave, and generates the reflection power with the carrier wave modulated corresponding to the input power; and
    an accumulation mode capacitor which adjusts an impedance of the tag driver by adaptively adjusting the capacitance according to the intensity of a voltage of the reflection power, and receives the reflection power from the controller and provides the reflection power to the tag antenna, the capacitance of the accumulation mode capacitor being changed if the reflection power is higher than a minimum power for backscattering, which modulates the carrier wave and loads the signal wave including the data into the carrier wave, and the minimum power is calculated as below:

$$P_{bs} = \frac{P_a}{4} \times |\rho_1 - \rho_2|^2,$$

where $P_{bs}$ is the minimum power for backscattering, $P_a$ is an effective power which is transmitted from the tag antenna and input to the tag driver, $\rho_1$ is a reflection coefficient if a digital signal value of the signal wave is 0, and $\rho_2$ is a reflection coefficient when the digital signal value of the signal wave is 1.

* * * * *